US007002237B2

(12) United States Patent
Takaishi (10) Patent No.: US 7,002,237 B2
(45) Date of Patent: Feb. 21, 2006

(54) SPHERICAL SHAPED SEMICONDUCTOR DEVICE, A FLEXIBLE PRINTED WIRING SUBSTRATE, AND MOUNTING METHOD THEREOF

(75) Inventor: Masakatsu Takaishi, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 44 days.

(21) Appl. No.: 10/442,127

(22) Filed: May 21, 2003

(65) Prior Publication Data

US 2003/0209792 A1 Nov. 13, 2003

Related U.S. Application Data

(63) Continuation of application No. 09/784,345, filed on Feb. 16, 2001, now abandoned.

(30) Foreign Application Priority Data

Feb. 18, 2000 (JP) .................................. 2000-040997

(51) Int. Cl.
*H01L 23/48* (2006.01)
*H01L 23/52* (2006.01)
*H01L 29/04* (2006.01)
*H01L 29/06* (2006.01)

(52) U.S. Cl. ...................... 257/627; 257/618; 257/690; 257/701; 257/688

(58) Field of Classification Search .............. 257/627, 257/618, 690, 701, 688, 750, 737, 738
See application file for complete search history.

(56) References Cited

U.S. PATENT DOCUMENTS 4,806,495 A  2/1989  Levine 5,028,546 A  7/1991  Hotchkiss
5,877,943 A  3/1999  Ramamurthi
5,945,725 A  8/1999  Ishikawa
5,955,776 A  9/1999  Ishikawa
6,004,396 A  12/1999  Ishikawa
6,069,682 A  5/2000  Ishikawa
6,261,247 B1  7/2001  Ishikawa et al.

FOREIGN PATENT DOCUMENTS

| JP | 5-183009 | 7/1993 |
| JP | 5-265021 | 10/1993 |
| JP | 2000-31189 | 1/2000 |
| JP | 2000-31190 | 1/2000 |
| WO | WO98/15983 | 4/1998 |
| WO | WO 98/25090 | 6/1998 |

OTHER PUBLICATIONS

Nikkei Microdevices No. 157 (Jul. 1, 1998).

*Primary Examiner*—Nitin Parekh
(74) *Attorney, Agent, or Firm*—Nixon & Vanderhye PC (57) ABSTRACT

A spherical shaped semiconductor device has a protective insulating film thereon and input/output connection openings that are located along a intersected portion on the protective insulating film where a plane face running through a center of the spherical shaped semiconductor device intersects the protective insulating film. More input/output connection openings are provided on the spherical shaped semiconductor device compared with a conventional square semiconductor device. The spherical shaped semiconductor device is connected to a flat circuit substrate through a flexible printed wiring substrate. A lower portion of the flexible printed wiring substrate is cut into divided sections for connecting input/output terminals of the flat circuit substrate. Connection between the spherical shaped semiconductor device and the flat circuit substrate does not cause any cracks or disconnection due to flexibility of the flexible printed wiring substrate.

19 Claims, 7 Drawing Sheets

SPHERICAL SHAPED SEMICONDUCTOR DEVICE, A FLEXIBLE PRINTED WIRING SUBSTRATE, AND MOUNTING METHOD THEREOF

This application is a continuation of application Ser. No. 09/784,345, filed Feb. 16, 2001 now abandoned, the entire content of which is hereby incorporated by reference in this application.

BACKGROUND OF THE INVENTION

The present invention relates to a spherical shaped semiconductor device, a flexible printed wiring substrate, and a mounting method of the spherical shaped semiconductor device with the flexible printed wiring substrate.

Regarding spherical shaped semiconductor devices, NIKKEI MICRODEVICES No. 157 issued on Jul. 1, 1998 and Weekly Toyo Keizai issued on Jul. 18, 1998 disclose a spherical semiconductor particle connected to an external printed circuit substrate, which BALL Semiconductor Inc. in U.S.A. has proposed in the U.S. Patent application Ser. Nos. 60/032,340, 08/858,004, and PCT/US97/14922.

Figure 9:
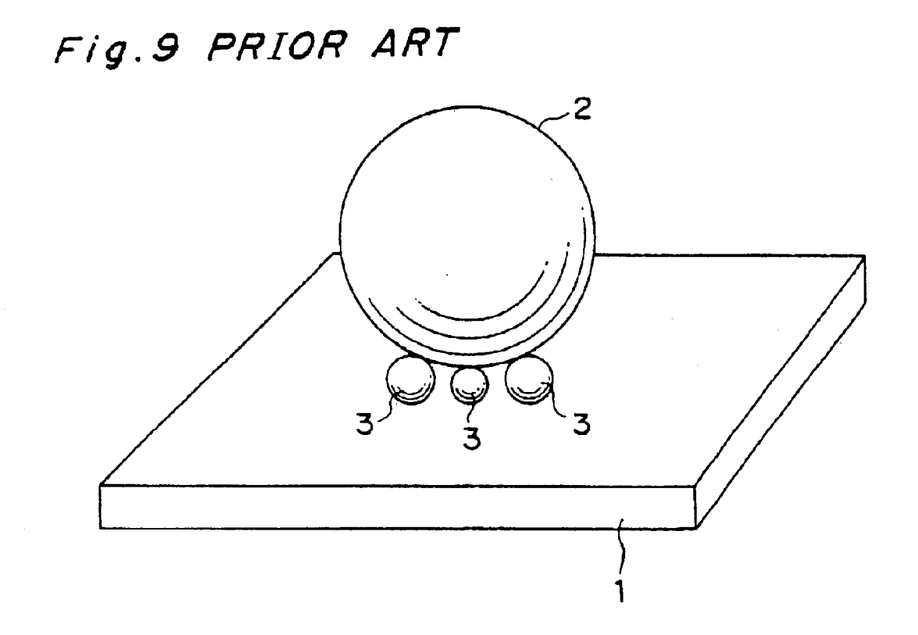
FIG. 9 is a view showing a conventionally mounted spherical shaped semiconductor device.

The above editions disclose that, as shown in FIG. 9, a bottom face of a spherical shaped semiconductor device 2 is connected to a printed circuit substrate 1 through a plurality of solder balls 3 thereon. According to the NIKKEI MICRODEVICES No. 157, a silicon ball is connected to a printed circuit substrate through electrodes disposed on the surface of the silicon ball. These electrodes are also used to connect a silicon ball to other silicon balls, the consequence of which brings about three-dimensional connections between silicon balls incorporated with various functionalities such as a memory and processor, thus implementing establishment of a system LSI.

However, the above-mentioned conventional mounting method has the following disadvantages.

Firstly, the number of accommodatable input/output connection openings in the spherical shaped semiconductor device 2 are limited. As known, the spherical shaped semiconductor device is three times larger in surface area than a conventional semiconductor device formed on a square shaped silicon circuit substrate. When the spherical shaped semiconductor device is wired according to the same wiring rule as that of the conventional semiconductor device formed on the square-shaped silicon circuit substrate, three times larger number of output connection openings are required to forward an output signal. Recent trends of BGA (Ball Grid Array) or CSP (Chip Size Package) indicate that larger chip size increases the number of contact pins. However, in the above-stated conventional method for mounting the spherical shaped semiconductor device, the spherical shaped semiconductor device 2 is connected to the printed circuit substrate 1 through the solder balls 3 installed on the bottom surface of the spherical shaped semiconductor device 2 and on contact points with other adjacent spherical shaped semiconductor device. Therefore, the number of accommodatable input/output connection openings is limited. In addition, there is another disadvantage that the spherical shaped semiconductor device 2 is in "point" contact with the printed circuit substrate 1 and other adjacent spherical shaped semiconductor devices. This is because the printed circuit substrate 1 is formed in a flat shape and the spherical shaped semiconductor device 2 and the other adjacent devices are formed in a ball-like shape.

Secondly, interfaces between the solder ball 3 and the spherical shaped semiconductor (silicon ball) 2 and between the solder ball 3 and the printed circuit substrate 1 are poor in reliability. This is because the silicon ball 2, solder ball 3, and the printed circuit substrate 1 are each different in a linear expansion coefficient. More specifically, the interfaces repeat expansion and shrinkage by change of temperature, so that stresses are accumulated in the interfaces to generate cracks and to finally lead to disconnection.

Thirdly, in the case of establishing a system LSI (Large Scale Integration) with spherical shaped semiconductor devices (silicon balls), a solder ball is disposed between the silicon balls. In this structure, there more remarkably comes out a harmful effect due to differences of the linear expansion coefficient among the silicon balls, the solder ball and a printed circuit substrate; and stresses are accumulated in the interfaces of the silicon balls. When a buffering section for releasing the stresses is not provided, the stresses are just accumulated, resulting in generation of cracks.

Fourthly, if a copper circuit having flexibility is used for the buffering section as stated above, thickness of the copper circuit should be extremely small. As an example of the copper circuit having flexibility, there is a known product in which a 0.3 $\mu$m (3000 Å) thick copper is deposited on a 38 $\mu$m thick polyester film by sputtering. However, the copper circuit with such a small thickness fails to supply necessary circuit resistance. Though it is possible to increase the film thickness of the copper circuit, there come disadvantages of decrease in productivity and increase in cost.

On the other hand, another method is to stack copper on a polyimide film with plating. However, when copper is applied to the extent equal in thickness to aluminum foil, this copper circuit degrades in flexibility. As a result, it is impossible to bend the copper circuit with a curvature radius equivalent to approximately one forth of the diameter of the spherical shaped semiconductor device, typically with a curvature radius of approximately 0.25 mm. This is because that copper is infinitely oxidized in the air. Therefore, it should be protected from being exposed to the air. To prevent copper from oxidation, gold plating or solder plating or tin plating is generally performed after applying nickel plating. Covering with a cover film or cover ink is another choice to protect the copper circuit from oxidation. However, there is a disadvantage that such a covering is insufficient in reliability. Besides, protection of the copper surface by using these methods makes the film thicker and harder, resulting in degradation of bendability.

SUMMARY OF THE INVENTION

Accordingly, it is an object of the present invention to provide a spherical shaped semiconductor device, as well as a mounting method therefor, which implements efficient deposition of input/output connection openings for mounting and realizes highly reliable connection with a printed circuit substrate, and to provide a flexible printed wiring substrate to be used for the mounting method.

In order to achieve the above-mentioned object, the present invention provides a spherical shaped semiconductor device electrically connected to a flat circuit substrate, comprising: a protective insulating film formed on an outer surface of the spherical shaped semiconductor device; and a plurality of input/output connection openings which are disposed along a intersected portion of the protective insulating film where a plane face orthogonal to an axis running through a center of the spherical shaped semiconductor device intersects the protective insulating film.

In one embodiment of the present invention, the axis running through the center of the spherical shaped semiconductor device is orthogonal to the flat circuit substrate.

According to this structure of the invention, a large number of the input/output connection openings are effectively arrayed on a circle along the intersected portion of the protective film on the spherical shaped semiconductor device. As a result, wiring density of the spherical shaped semiconductor device via the input/output connection openings are increased.

In one embodiment of the present invention, the input/output connection openings are disposed along a intersected portion of the protective insulating film where a plane face running through the center of the spherical shaped semiconductor device intersects the protective insulating film.

According to this structure, the input/output connection openings are disposed on a circle having a maximum diameter of the spherical shaped semiconductor device. Therefore, the larger number of input/output connection openings are arrayed effectively. It becomes possible to provide three times as large a number of input/output connection openings as a conventional semiconductor device formed on a square shaped silicon substrate whose side is equal to a diameter of the spherical shaped semiconductor device. It is also possible to apply the same wiring rule to the spherical shaped semiconductor device of this embodiment as that of the conventional semiconductor device.

The present invention also provides a flexible printed wiring substrate, comprising of a flexible resin layer and an flexible metallic foil layer stacked on the resin layer, wherein the metallic foil layer forms circuit patterns to electrically connect a spherical shaped semiconductor device to a flat circuit substrate on which the spherical shaped semiconductor device is mounted.

According to this structure, the flexible printed wiring substrate of the present invention helps the spherical shaped semiconductor device to be wired and mounted effectively onto the flat circuit substrate without causing cracks or disconnection. The spherical shaped semiconductor device is freely and smoothly connected to the flat circuit substrate because of flexibility of the flexible printed wiring substrate.

In one embodiment of the present invention, the resin layer is made of polyimide.

According to this structure, polyimide is used as a base in the flexible printed wiring substrate. Polyimide has not only high heat-resistance but also a low thermal expansion coefficient. Accordingly, even if the wiring substrate is exposed to rapid temperature changes after mounting, the wiring substrate hardly changes in size. so that stresses given to each connected section is remained small. In addition, polyimide itself is highly flexible and therefore offers sufficient flexibility to the flexible printed wiring substrate.

In one embodiment of the present invention, the metallic foil layer is made of aluminum.

It is known that pure aluminum forms an oxide film on its surface immediately after exposed to the air to protect inside thereof. Moreover, when purity of aluminum is enhanced to the extent of 99.9% or more, a local battery is not formed in the aluminum even if the aluminum is exposed to the air. Therefore, the aluminum is prevented from corroding unless corrosive gases are present. In other words, even if a pure aluminum foil is not covered with a protective film, the pure aluminum foil does not corrode unlike the case of copper foil. According to the above structure, the aluminum foil saves a process of forming a protective film on a surface of the aluminum foil. Sufficient flexibility is provided for the flexible printed wiring substrate because the protective film is not formed on the aluminum foil.

In one embodiment of the present invention, a lower portion of the flexible printed wiring substrate located on a side of the flat circuit substrate is cut into a plurality of divided sections to be connected to input/output terminals of the flat circuit substrate.

According to this structure, the divided sections in the lower portion of the flexible printed wiring substrate are allowed to move independently of an undivided body of the flexible printed wiring substrate. The divided sections can be outwardly curved to expand in the radial directions. Therefore, the circuit substrate and the spherical shaped semiconductor device is freely and easily connected each other by expanding the divided sections in the radial directions even if the input/output terminals of the circuit substrate are arrayed in a larger interval than that of the spherical shaped semiconductor device.

When the divided sections of the flexible printed wiring substrate is curved with an appropriate curvature radius, for example, a curvature radius approximately equal to one forth of a diameter of the spherical shaped semiconductor device, the input/output connection openings of the spherical shaped semiconductor device are easily connected to the input/output terminals of the circuit substrate by the flexible printed wiring substrate.

When a sag is given to a middle portion of the divided section, the sag acts as a buffer to absorb stresses generated by expansion or shrinkage of the spherical shaped semiconductor device, flexible printed wiring substrate and the circuit substrate caused by environmental changes including rapid changes in temperature and humidity, and a combination thereof.

In one embodiment of the present invention, an upper portion of the flexible printed wiring substrate located on a side of the spherical shaped semiconductor device is cut into a plurality of divided sections to be connected to input/output terminals of the spherical shaped semiconductor device.

According to this structure, the divided sections in the upper portion of the flexible printed wiring substrate are allowed to move independently of the undivided body of the flexible printed wiring substrate. The divided sections can be curved to expand in the radial directions. Therefore, the flexible printed wiring substrate and the spherical shaped semiconductor device is freely and easily connected each other by expanding the divided sections in the radial directions even if the input/output connection openings are not disposed along the intersected portion where the plane face running through the center of the spherical shaped semiconductor device intersects the protective insulating film on the spherical shaped semiconductor device.

In one embodiment of the present invention, the flexible printed wiring substrate has a divided section longer than other divided sections.

According to this structure, the longer divided section of the pure aluminum foil can be easily connected to a connection terminal or a circuit located far away from the input/output terminals for the other divided sections. The connection terminal is a connector placed on the surface of the circuit substrate or an internal layer circuit of the circuit substrate, for example.

The present invention also provides a mounting method of a spherical shaped semiconductor device on a flat circuit substrate, comprising the steps of: winding an upper portion of a flexible printed wiring substrate around an outer surface of the spherical shaped semiconductor device; connecting the upper end portion of the flexible printed wiring substrate to input/output terminals of the spherical shaped semiconductor device through input/output openings of the spherical shaped semiconductor device; expanding in radial directions a plurality of divided sections formed by cutting a lower portion of the flexible printed wiring substrate; and connecting the divided sections of the flexible printed wiring substrate to input/output terminals of the flat circuit substrate.

According to the above method, The spherical shaped semiconductor device has the larger number of input/output connection openings, compared with a conventional semiconductor device formed on a square shaped silicon substrate, and the spherical shaped semiconductor device is freely connected to the flat circuit substrate through the flexible printed wiring substrate without causing cracks or disconnection due to flexibility of the flexible printed wiring substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAIDED DESCRIPTION OF THE PREFERRED EMBODIMENTS

A preferred embodiment of the present invention will be described hereinafter in details with reference to the drawing.

Figure 1:
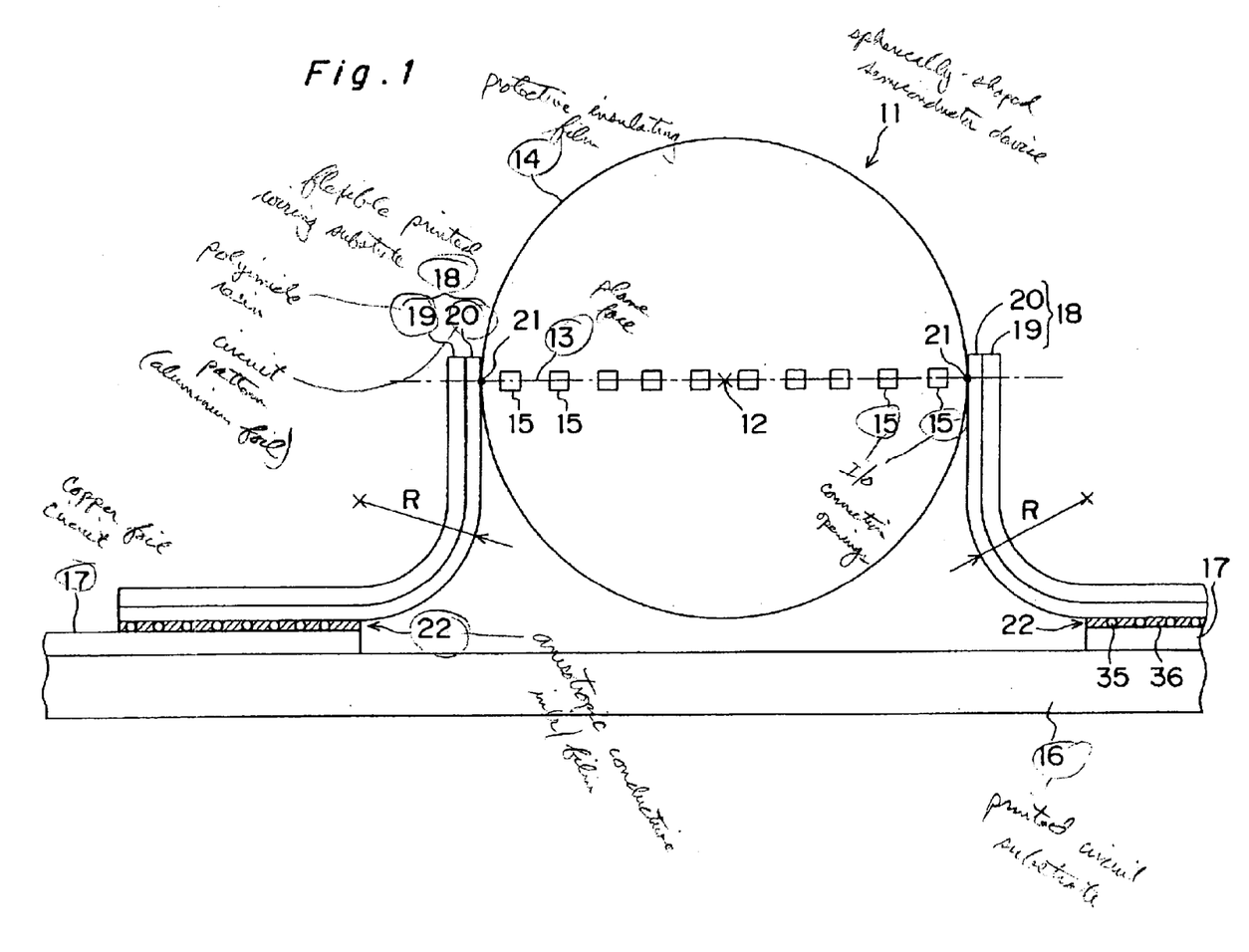
FIG. 1 is a view showing a spherical shaped semiconductor device mounted on a printed circuit substrate according to the present invention.

FIG. 1 shows a spherical shaped semiconductor device 11 mounted on a flat printed circuit substrate 16 in accordance with the preferred embodiment of the present invention. The spherical shaped semiconductor device 11 is equipped with input/output connection openings 15 at a specific interval on a portion of a protective insulating film 14 at which the protective insulating film 14 is intersected with a plane face 13 running through the center 12 of the spherical shaped semiconductor device 11. The spherical shaped semiconductor device 11 is mounted on the printed circuit substrate 16 through a flexible printed wiring substrate 18. An input/output terminal (not illustrated) inside the input/output connection opening 15 is electrically connected to a copper foil circuit 17 on the printed circuit substrate 16. A detailed structure of the spherical shaped semiconductor device 11 is omitted because such a detailed structure is not directly related to this invention.

The flexible printed wiring substrate 18, as described in detail hereinafter, has two-layer structure consisting of a polyimide resin 19 having high heat resistance and a circuit pattern 20 made of highly flexible aluminum foil, the two layers being joined together without using an adhesive. As a result, the flexible printed wiring substrate 18 hardly changes in size, and even if connected portions are moved, such a movement is absorbed by flexibility of the flexible printed wiring substrate 18.

To electrically connect the flexible printed wiring substrate 18 to the input/output terminals inside the input/output connection openings 15 of the spherical shaped semiconductor device 11, one end of the circuit pattern 20 of the printed wiring substrate 18 is joined to the input/output terminals of the spherical shaped semiconductor device 11 with an anisotropic conductive adhesive 21. On the other hand, electric connection between the flexible printed wiring boar 18 and the copper foil circuit 17 on the printed circuit substrate 16 is conducted by joining the other end of the circuit pattern 20 of the flexible printed wiring substrate 18 to the copper foil circuit 17 with an anisotropic conductive ink (or an anisotropic conductive film) 22.

Hereinafter, we make in sequence a description of a manufacturing method and an outside forming method for the flexible printed wiring substrate 18, a mounting method for the spherical shaped semiconductor device 11 using the flexible printed wiring substrate 18, and a jig used in the mounting.

Figure 2A:
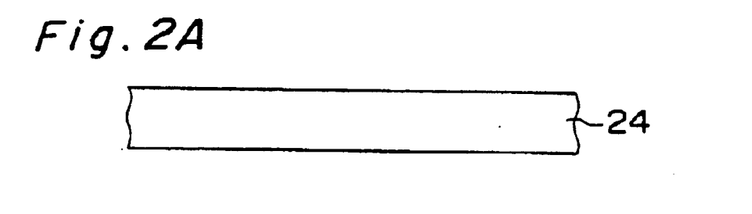
FIG. 2A–2E is a longitudinal sectional view of the flexible printed wiring substrate shown in FIG. 1 during manufacturing process.

With reference to FIGS. 2A to 2E, the manufacturing method for the flexible printed wiring substrate 18 is explained. FIGS. 2A to 2E are longitudinal sectional views of a laminated structure of the flexible printed wiring substrate 18 under a manufacturing process. First, as shown in FIG. 2A, a surface of an aluminum foil 24 is cleaned by grinding or alkali treatment (not illustrated). The grinding or alkali treatment has been widely performed for surface treatment of aluminum foil and copper foil. A primary object of the grinding or alkali treatment is to remove foreign substances, organic matters, and oxide films having irregular thickness present on the surface of the aluminum foil 24 so as to produce a homogeneous oxide film with uniform thickness.

Figure 2B:
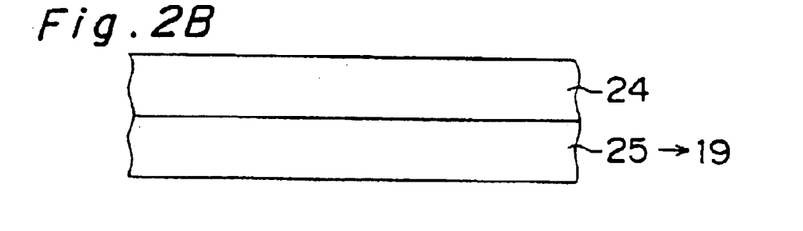
Figure 3:
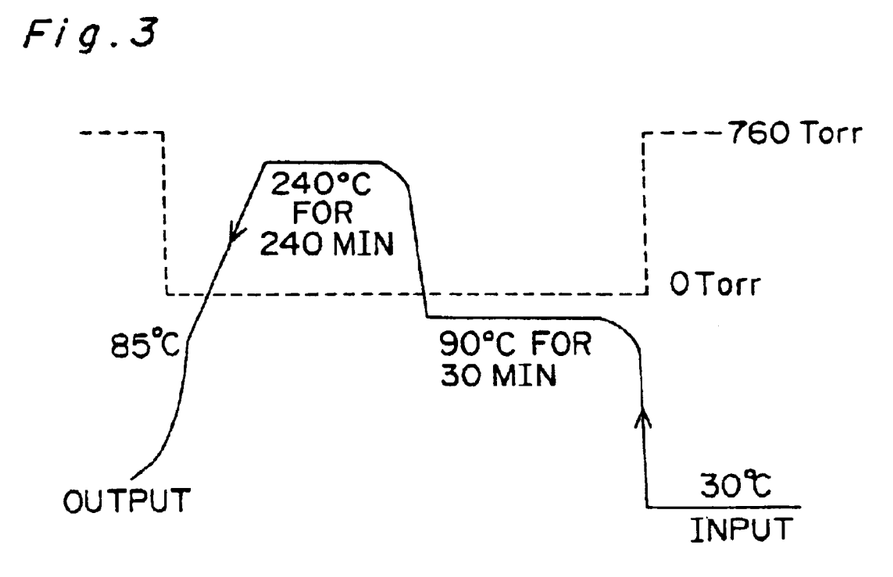
FIG. 3 is a view showing a temperature and pressure profile when drying to harden a polyimide resin solution during the manufacturing process shown in FIG. 2.

A polyimide resin solution 25 is applied on the surface of the aluminum foil 24 after the surface treatment thereof, as shown in FIG. 2B. The aluminum foil 24 used in this embodiment is hyperpure foil (purity of 99.9%) with thickness of 15 $\mu$m manufactured by Nippon Foil Manufacturing Co., Ltd. An adhesive polyimide manufactured by PI R&D CO., LTD is used for the polyimide resin solution 25. The amount of the polyimide resin solution 25 is so controlled that a completed flexible printed wiring substrate 18 becomes 20 $\mu$m to 25 $\mu$m in thickness. The polyimide resin solution 25 is then dried for hardening in accordance with a temperature and pressure profile shown in FIG. 3 to form the two-layer structure consisting of the polyimide resin 19 and the aluminum foil 24.

Figure 2C:
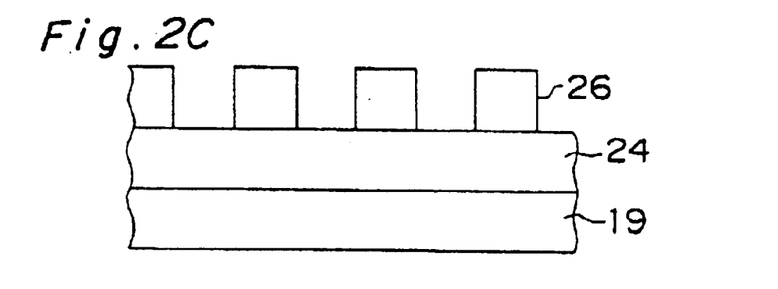
Figure 2D:
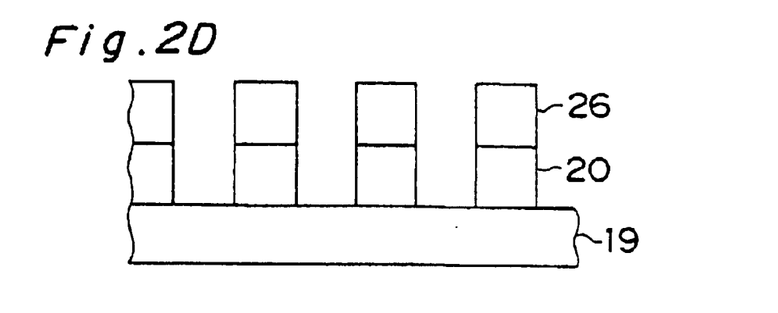
Figure 2E:
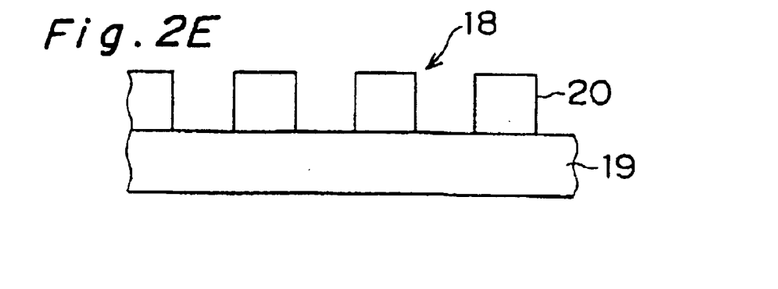

After the polyimide resin 19 is hardened, a photoresist is applied to the surface of the aluminum foil 24, which is then pre-baked and covered with a photo mask for exposure and development to form a photoresist pattern 26, as shown in FIG. 2C. Thus-produced photoresist pattern 26 is then used as a mask, as shown in FIG. 2D, to etch the aluminum foil 24 with an etchant. After etching, the photoresist pattern 26 is exfoliated and the aluminum foil circuit pattern 20 is formed on the polyimide resin 19.

The anisotropic conductive adhesive 21 is adhered to a portion of the circuit pattern 20 of the flexible printed wiring substrate 18 that is formed as described above, the portion of the circuit pattern 20 being opposed to the input/output connection opening 15 of the spherical shaped semiconductor device 11 at the time of mounting. The anisotropic conductive adhesive 21 may be a paste type product capable of screen-printing or a pre-shaped anisotropic conductive tape.

Figure 4A:
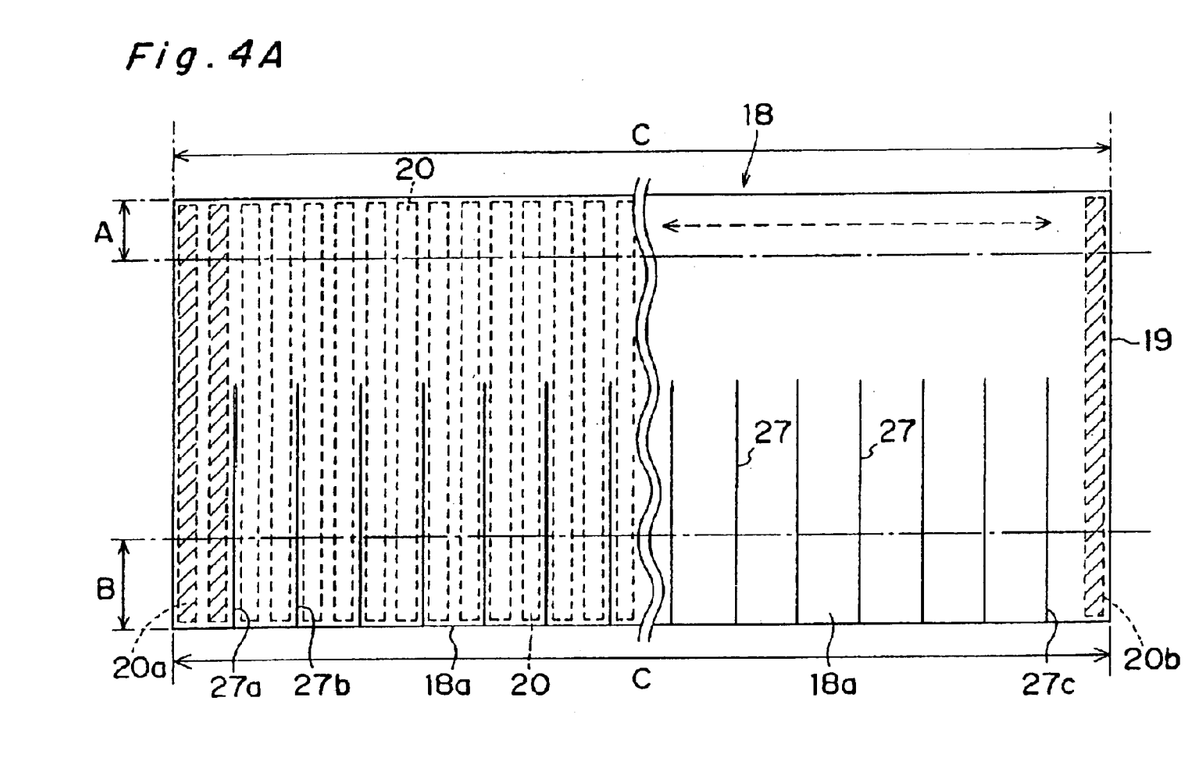
FIG. 4 is a plan view of a completed flexible printed wiring substrate, and a cross sectional view of the same.
Figure 4B:
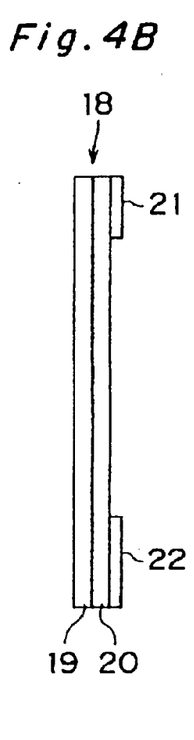

Next, we will make a description of the outside-shape forming method for the flexible printed wiring substrate 18. FIG. 4A and FIG. 4B show a plan view and a cross sectional view of the completed printed wiring substrate 18, respectively. As shown in FIG. 4B, an anisotropic conductive ink 22 is screen-printed on (or an anisotropic conductive film 22 is attached to) portions of a plurality of strip-shaped circuit patterns 20, the portions of which are opposed to the copper foil 17 on the printed circuit substrate 16 at the time of mounting. The flexible printed wiring substrate 18 is then subject to cutting for so as to facilitate the mounting of the spherical shaped semiconductor device 11 on the printed circuit substrate 16.

The cutting is performed with a carbon dioxide laser, by providing cut lines 27 in the flexible printed wiring substrate 18 along the circuit pattern 20 at intervals of two strips of the circuit pattern 20. Consequently, in the present embodiment, the cut lines 27 are consisted of twenty three cut lines from 27a to 27c, and the circuit pattern 20 is consisted of forty eight circuit patterns from 20a to 20b, as shown in FIG. 4A.

In FIG. 4A, the anisotropic conductive adhesive 21 is adhered to a section which is enclosed by a range of A and a range of C, the section being connected to the input/output terminals of the spherical shaped semiconductor device 11. The anisotropic conductive ink (or anisotropic conductive film) 22 is formed on a section which is enclosed by a range of B and a range of C, the section being connected to the copper foil circuit 17 of the printed circuit substrate 16. As shown in FIG. 1, twenty-four sections divided by the twenty-three cut lines 27 are curved with a curvature radius R in the flexible printed wiring substrate 18.

Figure 5:
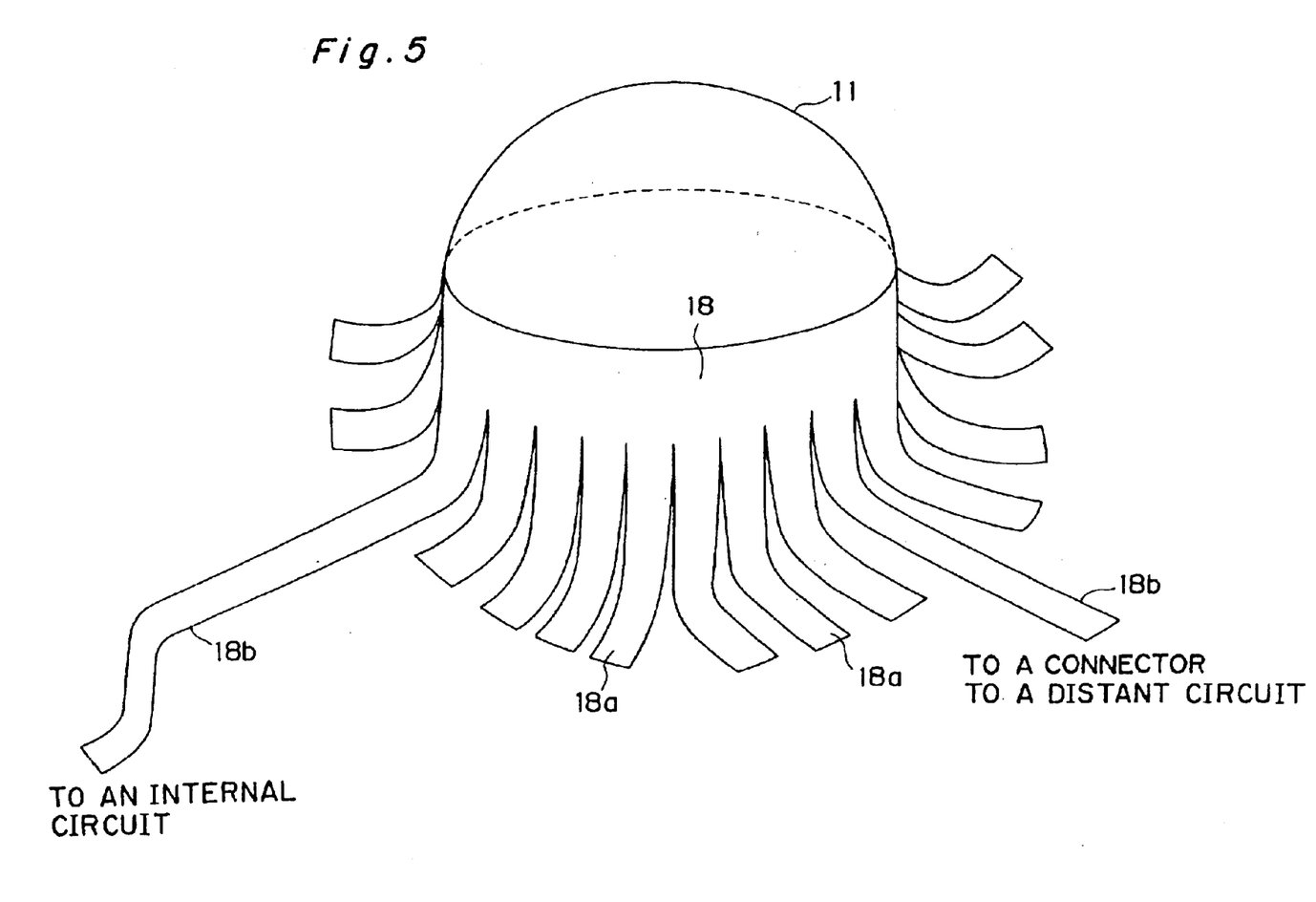
FIG. 5 is a view showing a curvaturing and spreading pattern of the spherical shaped semiconductor device shown in FIG. 1 in its mounted state.

As described above, the flexible printed wiring substrate 18 has a plurality of divided sections 18a after the outside-shape forming. Each of the divided section 18a has at least one circuit pattern 20 consisting of one conductive wiring and is connected to the printed circuit substrate 16. When the flexible printed wiring substrate 18 is used to mount the spherical shaped semiconductor device 11 on the printed circuit substrate 16, the divided sections 18a of the flexible printed wiring substrate 18 are curved to radiate, as shown in FIG. 5, so that contact faces between the flexible printed wiring substrate 18 and the printed circuit substrate 16 are secured.

Accordingly, while the contact faces are secured between circuit patterns 20 of the flexible printed wiring substrate 18 and an input/output terminals of the printed circuit substrate 16, an interval between the input/output connection openings 15 of the spherical shaped semiconductor device 11 is changed to an interval between the input/output terminals of the printed circuit substrate 16 by widening an interval between adjacent circuit patterns 20. In addition, stresses between the spherical shaped semiconductor device 11 and the printed circuit substrate 16 can be absorbed because the spherical shaped semiconductor device 11 is connected to the printed circuit substrate 16 only through the flexible printed wiring substrate 18. This prevents disconnection and other troubles which are attributed to the stresses between the spherical shaped semiconductor device 11 and the printed circuit substrate 16 as seen in connection by the conventional solder balls.

Figure 6:
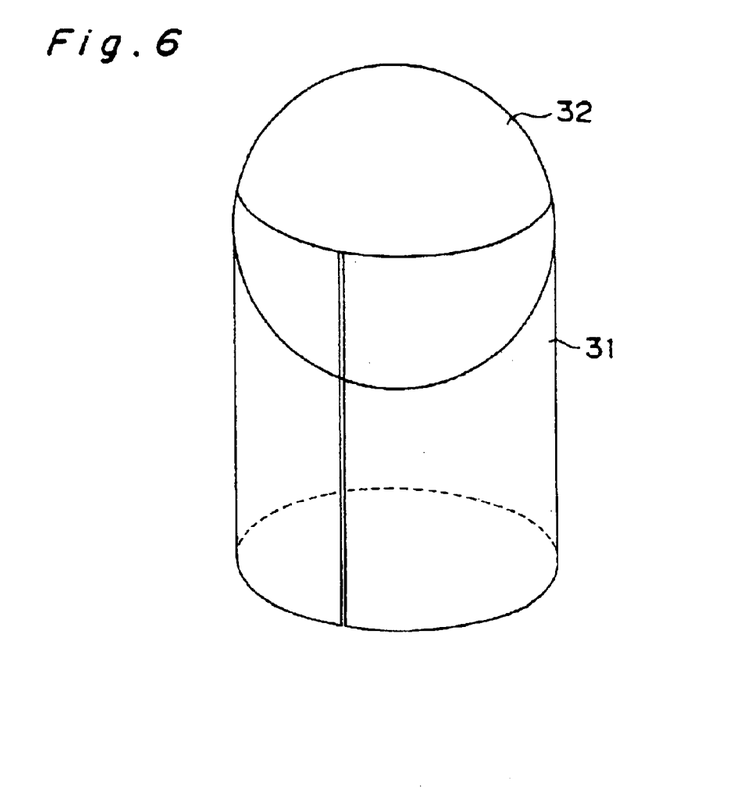
FIG. 6 is a view showing a flexible printed wiring substrate without cut lines mounted on the spherical shaped semiconductor device.

The flexible printed wiring substrate 18 has a plurality of divided sections on its lower side (or its upper and lower sides) as mentioned above. The reason for this is explained with reference to FIG. 6. In FIG. 6, the flexible printed wiring substrate 31, which is wound around the spherical shaped semiconductor device 32, has no divided sections. In other words, a lower portion of the flexible printed wiring substrate 31 has no cut line between aluminum foil circuit patterns (not shown). Therefore, the lower portion of the flexible printed wiring substrate 31 cannot be curved outwards. It is required to provide cut lines in the flexible printed wiring substrate, just like cut lines 27a, 27b and 27c shown in FIG. 4A, in order to curve the lower portion of the flexible printed wiring substrate independently of the undivided portion thereof.

Next, the number of divided sections of the flexible printed wiring substrate 18 is specified. The upper portion of the flexible printed wiring substrate 18 is required to fit to the external shape (spherical shape) of the spherical shaped semiconductor device 11. The lower portion of the flexible printed wiring substrate 18 is required to cover the copper foil circuit 17 of the printed circuit substrate 16. If the lower portion of the flexible printed wiring substrate 18 is divided into 4 sections, the spherical shaped semiconductor device 11 is encompassed by the upper portion of the flexible printed wiring substrate 18 having inclination to a shape of a square. If the lower portion of the flexible printed wiring substrate 18 is divided into 6 sections, it is encompassed by the upper portion thereof having inclination to a shape of an equilateral hexagon. In both cases of the above, the flexible printed wiring substrate 18 falls short of reaching the input/output connection openings 15 of the spherical shaped semiconductor device 11. Attempts to force the upper portion of the flexible printed wiring substrate 18 to reach the input/output connection openings 15 cause wrinkles on flexible printed wiring substrate 18. Therefore, in order to uniformly fit the flexible printed wiring substrate 18 to the external shape of the spherical shaped semiconductor device 11, the lower portion of the flexible printed wiring substrate 18 is required to have twelve or more, preferably twenty-four, cut lines 27. The number of cut lines 27 is determined from the view point of facilitating design, and protecting the flexible printed wiring substrate 18 from developing wrinkles when fit to the exterior of the spherical shaped semiconductor device 11, and enabling the flexible printed wiring substrate 18 to encompass the spherical shaped semiconductor device 11 in a shape close to a circle (an approximate circumscribed circle), as shown in FIG. 5.

There is described a method for mounting the spherical shaped semiconductor device 11 using the above-stated flexible printed wiring substrate 18. The anisotropic conductive adhesive 21 and the anisotropic conductive ink (or anisotropic conductive film) 22 consist of binder 36 containing conductive filler 35, as shown in FIG. 1. Nickel particles, with gold plating applied to the surface thereof, are generally used for the conductive filler 35; and epoxy resin is used for the binder 36.

When the spherical shaped semiconductor device 11 is mounted as shown in FIG. 1, positioning of the flexible printed wiring substrate 18, spherical shaped semiconductor device 11 and the printed circuit substrate 16 is first conducted. Then, heat and pressure are applied over the flexible printed wiring substrate 18. The heat melts the binder 36 contained in the anisotropic conductive adhesive 21 and the anisotropic conductive ink (or anisotropic conductive film) 22, and the pressure infiltrates the conductive filler 35 into the circuit pattern (aluminum foil) 20 of the flexible printed wiring substrate 18 and the copper foil circuit 17 of the printed circuit substrate 16. Thereby, conductivity is obtained between the spherical shaped semiconductor device 11 and the flexible printed wiring substrate 18, and between the flexible printed wiring substrate 18 and the printed circuit substrate 16.

As describe above, the flexible printed wiring substrate 18 is curved and sagged with the curvature radius R, equal to one forth of a diameter of the spherical shaped semiconductor device 11, a sag given to the flexible printed wiring substrate 18 making it possible to cope with rapid environment changes. In addition, the flexible printed wiring substrate 18 itself has a stacked structure consisting of the polyimide resin 19 with high heat resistance and the aluminum foil 20 with high flexibility, these two layers being attached to each other without using an adhesive, resulting in less size changes. Even though the connected area is displaced, the impact therefrom is absorbed by the sagged portion given to the flexible printed wiring substrate 18.

There are described a jig and a method for connecting the input/output terminals of the spherical shaped semiconductor device 11 via the input/output connection opening 15 thereof to the circuit pattern 20 (at the side of the anisotropic conductive adhesive 21) of the flexible printed wiring substrate 18.

Figure 7:
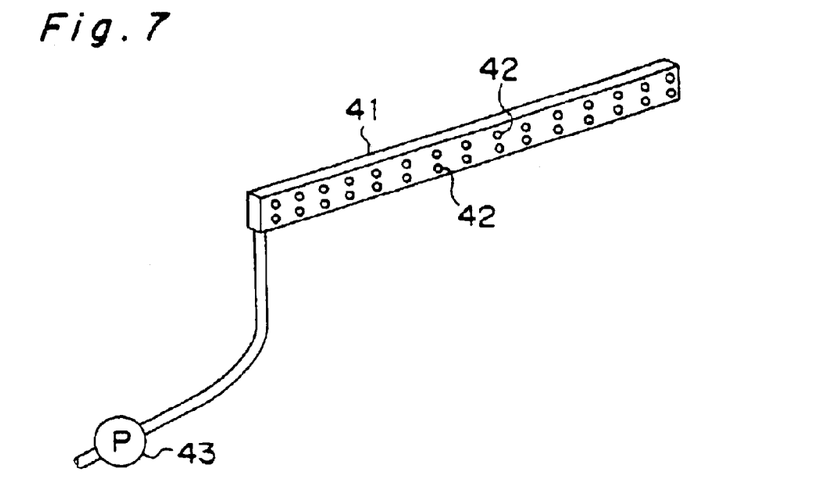
FIG. 7 is an outline perspective view of a flexible heater.
Figure 8:
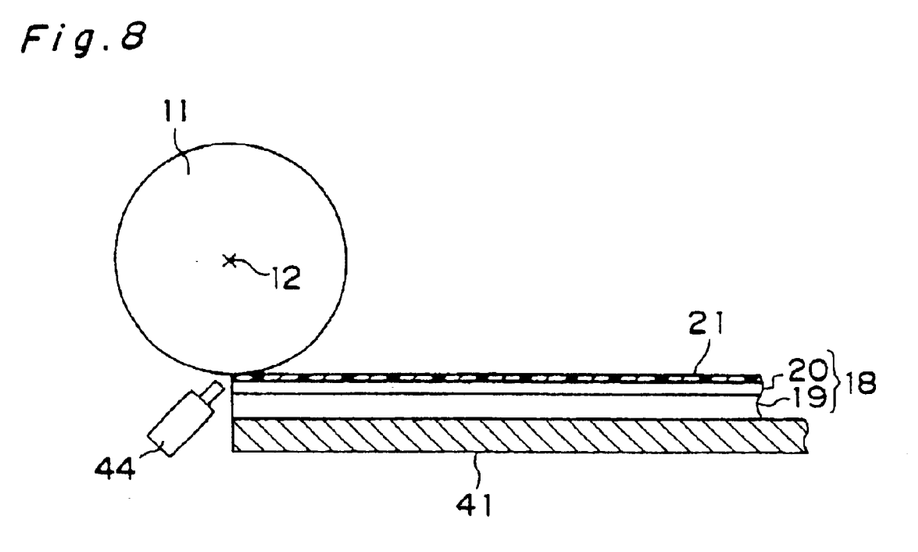
FIG. 8 is a conceptual view showing the flexible printed wiring substrate ready to be wound around the spherical shaped semiconductor device by using the flexible heater shown in FIG. 7.

FIG. 7 is an outline perspective view of a flexible heater 41 as a connection jig. FIG. 8 is a plan view showing the flexible printed wiring substrate 18 ready to be wound around the spherical shaped semiconductor device 11 with the flexible heater 41 shown in FIG. 7. In order to make the description to be easily understood, scales of spherical shaped semiconductor device 11, flexible printed wiring substrate 18 and the flexible heater 41 are inconsistent.

The flexible heater 41 has a longitudinal length equal to the long sides of the flexible printed wiring substrate 18, designated as C in FIG. 4A. Adsorption openings 42 are disposed all over one face of the flexible heater 41. The face of the flexible heater 41 having the adsorption openings 42 is applied to a section of the polyimide resin 19 in the flexible printed wiring substrate 18, the section of which is on the opposite side of the anisotropic conductive adhesive 21, so as to adsorb the section with a vacuum pump 43. In this state, as shown in FIG. 8, the position of a circuit pattern 20 located on the outermost end of the flexible printed wiring substrate 18 is aligned with one of the input/output connection openings 15 on the spherical shaped semiconductor device 11. The flexible heater 41 together with the flexible printed wiring substrate 18 is wound around the exterior of the spherical shaped semiconductor device 11 in the direction of the array of the input/output connection openings 15. In this way, the circuit patterns 20 of the flexible printed wiring substrate 18 are connected to the input/output terminals of the spherical shaped semiconductor device 11 via the input/output connection openings 15 thereof.

Upon winding, declination between each circuit pattern 20 of the flexible printed wiring substrate 18 and each input/output connection opening 15 of the spherical shaped semiconductor device 11 is read by using a positioning sensor camera 44. Based on the declination read by the positioning sensor camera 44, positioning of the circuit pattern 20 and the input/output connection opening 15 is conducted. As for the positioning method, the description therefor is omitted as it has no direct relation with the embodiment of the present invention.

After positioning as described above, pressure is applied to the flexible heater 41 toward the center of the spherical shaped semiconductor device 11, and heat is simultaneously applied to the flexible printed wiring substrate 18 by the flexible heater 41. As for conditions of heat and pressure, heating temperature ranges from 150 to 250° C., the pressure ranges from 20 to 100 grams per input/output connection opening 15, and an application period of the pressure ranges from 8 to 15 seconds.

The connection between the flexible printed wiring substrate 18 and the printed circuit substrate 16 is finally explained. When an edge on the one long side of the flexible printed wiring substrate 18 is connected, to the spherical shaped semiconductor device 11, an edge on the other long side thereof is positioned lower than the bottom surface of the spherical shaped semiconductor device 11. Consequently, when the spherical shaped semiconductor device 11 with the flexible printed wiring substrate 18 is put closer to the printed circuit substrate 16 from above, the divided sections 18a of the flexible printed wiring substrate 18 expand radially in all outward directions as shown in FIG. 5. After positioning an end of each circuit pattern 20 on the flexible printed wiring substrate 18 to the copper foil circuit 17 on the printed circuit substrate 16, heat and pressure is applied to the flexible printed wiring substrate 18 so as to establish connection between the circuit pattern 20 and the copper foil circuit 17. As for conditions of heat and pressure, heating temperature ranges from 150 to 250° C., the pressure ranges from 20 to 100 grams per circuit pattern 20, and an application period of the pressure ranges from 8 to 15 seconds.

The divided sections 18a of the flexible printed wiring substrate 18 may have the same length as shown in FIG. 4A. Some of the divided sections 18a i.e. the specific divided sections 18b may be longer than other the residual divided sections 18a, as described in FIG. 5.

By providing difference in length between the divided sections 18a and the specific divided sections 18b, the specific divided section 18b can be, for example, inserted to a connector (not illustrated) placed on the surface of the printed circuit substrate 16. Even if a connection terminal of the connector is located higher than the surface of the printed circuit substrate 16, the divided section 18b can be connected to the connection terminal of the connector while an end portion of the divided section 18b is floated in midair. When an internal circuit of the printed circuit substrate 16 is structured to be visible through a contact opening or the like from the front side, the divided section 18b can be connected to the printed circuit substrate 16 by inserting the end of the divided section 18b to the contact opening or the like. Connecting the divided section 18b to the internal circuit of the printed circuit substrate 16 in this way may be substituted for a jumper circuit. A longer divided section 18b also enables the spherical shaped semiconductor device 11 to be connected to a distant circuit.

As described hereinbefore, the spherical shaped semiconductor device 11 in this embodiment has the input/output connection openings 15 in the protective insulating film 14 on the spherical shaped semiconductor device 11, wherein the input/output connection openings 15 are placed at intersection of the protective insulating film 14 and the plane 13 running through the center 12 of the spherical shaped semiconductor device 11. Accordingly, the spherical shaped semiconductor device 11 can easily accommodate three times larger number of input/output connection openings 15 on the surface thereof than that of a conventional square-shaped semiconductor device formed on a silicon substrate. As a result, it will be appreciated that the same wiring rule as that of the conventional semiconductor device is available when the spherical shaped semiconductor device 11 is mounted.

In addition, when the spherical shaped semiconductor device 11 is mounted on the printed circuit substrate 16 with the copper foil circuit 17 formed thereon, there is used the flexible printed wiring substrate 18. The flexible printed wiring substrate 18 has two-layer structure consisting of the polyimide resin 19 with high heat-resistance and the circuit pattern 20 made from aluminum foil with high flexibility. The edge on the one long side of the flexible printed wiring substrate 18 has the cut lines 27 to form a plurality of divided sections 18a, each of which contains at least one circuit pattern 20. The edge having no cut lines on the other long side of the flexible printed wiring substrate 18 is wound along the input/output connection openings 15 on the spherical shaped semiconductor device 11. Thereby, one end of the circuit pattern 20 of the flexible printed wiring substrate 18 is connected to the input/output terminal of the spherical shaped semiconductor device 11. The other end of the circuit pattern 20 of the divided section 18a is connected to the copper foil circuit 17 on the printed circuit substrate 16.

Accordingly, although the input/output connection openings 15 and the copper foil circuit 17 are different in array interval, connection therebetween is easily established by adjusting intervals between divided sections 18a of the flexible printed wiring substrate 18.

As described before, the flexible printed wiring substrate 18 has two-layer structure consisting of the polyimide resin 19 and the circuit pattern 20 made from aluminum foil. The polyimide resin 19 has a low thermal expansion coefficient as well as a high heat resistance. Accordingly, even when the polyimide resin 19 is exposed to rapid temperature change after mounting, the size change thereof is small so that stresses given to each connection section is remained small. Furthermore, the polyimide resin 19 itself is highly flexible and therefore provides sufficient flexibility for the flexible printed wiring substrate 18. In addition, when aluminum is high in purity, aluminum forms an oxide film on the surface thereof immediately after exposed to the air to protect inside thereof. Moreover, decreasing impurities in aluminum to the extent of achieving purity of 99.9% or more inhibits formation of a local battery in the air, so that corrosion of aluminum is prevented unless corrosive gases are present. This saves applying a protective film to the surface of aluminum foil to prevent corrosion as with the case of copper substrates. By producing the circuit pattern 20 with aluminum foil which does not require addition of a protective film on the surface, sufficient flexibility is provided for the flexible printed wiring substrate 18.

As a result, the flexible printed wiring substrate 18 with high flexibility can be curved and sagged with a curvature radius R equal to, for example, one forth of a diameter of the spherical shaped semiconductor device 11. Thus, stresses caused by displacement of each connection section due to difference of a linear expansion coefficient or others are absorbed by the sag of the flexible printed wiring substrate 18, preventing disconnection conventionally generated in the case of using solder balls for mounting. According to the embodiment of the present invention, a mounting structure of the spherical shaped semiconductor device is obtained with high reliability.

It should be noted that in the mounting process described above, the flexible printed wiring substrate 18 is constructed by attaching the polyimide resin 19 and the circuit pattern 20 to each other without using an adhesive. Consequently, the polyimide resin 19 and the circuit pattern 20 are not detached by repeated expansion or shrinkage, thereby promising higher reliability.

Although, in the embodiment of the present invention described above, the flexible printed wiring substrate 18 is so structured as to have the strip-shaped circuit patterns 20 on each of the divided sections 18a and 18b, it will be understood that the shape of the circuit pattern 20 is not limited to such a shape as the above. For example, the circuit pattern 20 may have a wider end corresponding to a width of the copper foil circuit 17 on the printed circuit substrate 16 or a width of the connection terminal of the connector. It is also possible to further divide the end portion of the divided section 18a. The divided end portions of the one divided section 18a makes it possible to connect one input/output terminal on the spherical shaped semiconductor device 11 to a plurality of different copper foil circuits 17 or a plurality of connectors.

It should be understood that the location of the input/output connection openings 15 on the spherical shaped semiconductor device 11 is not limited to the intersection of the protective insulating film 14 and the plane face 13 running through the center 12. However, the largest number of input/output connection openings 15 can be accommodated when the input/output connection openings 15 are disposed at the intersection as stated above. From the viewpoint of bending stress in the flexible printed wiring substrate 18, it is preferable to dispose the input/output connection openings 15 at intersection of the protective insulating film 14 and a plane face which is parallel to the plane face 13 and which is located in the protective insulating film 14 on the opposite side to the printed circuit substrate 16 with relation to the plane face 13. In this case, however, it is required to provide the cut lines 27 on both long sides of the flexible printed wiring substrate 18. It is then possible to adopt the flexible printed wiring substrate 18 having a sector shape in development rather than a rectangular shape as shown in FIG. 4A.

Referring to FIG. 5, the divided sections 18a and 18b of the flexible printed wiring substrate 18 are disposed in a radial pattern. However, it should be understood that the divided sections 18a and 18b may be so disposed as to cross each other, when necessary in mounting, on condition that a base film of the flexible printed wiring substrate 18 is insulated.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A spherical shaped semiconductor device provided on a flat circuit substrate, comprising:

a protective insulating film formed on an outer surface of the spherical shaped semiconductor device; and a plurality of input/output connection openings which are disposed along a intersected portion of the protective insulating film where a plane face orthogonal to an axis running through a center of the spherical shaped semiconductor device intersects the protective insulating film, wherein the spherical shaped semiconductor device is electrically connected to the flat circuit substrate through a flexible printed wiring substrate wound around the spherical shaped semiconductor device.

2. The spherical shaped semiconductor device according to claim 1, wherein the axis running through the center of the spherical shaped semiconductor device is orthogonal to the flat circuit substrate.

3. The spherical shaped semiconductor device according to claim 2, wherein the input/output connection openings are disposed along a intersected portion of the protective insulating film where a plane face running through the center of the spherical shaped semiconductor device intersects the protective insulating film.

4. The spherical shaped semiconductor device according to claim 1 wherein the flexible printed wiring substrate comprises:

a flexible resin layer; and a flexible metallic foil layer stacked on the resin layer, wherein the metallic foil layer forms circuit patterns to electrically connect the spherical shaped semiconductor device to the flat circuit substrate.

5. The spherical shaped semiconductor device according to claim 4, wherein the resin layer is made of polyimide.

6. The spherical shaped semiconductor device according to claim 4, wherein the metallic foil layer is made of aluminum.

7. The spherical shaped semiconductor device according to claim 4, wherein a lower portion of the flexible printed wiring substrate located on a side of the flat circuit substrate is cut into a plurality of divided sections to be connected to input/output terminals of the flat circuit substrate.

8. The spherical shaped semiconductor device according to claim 7, wherein the flexible printed wiring substrate has a divided section longer than other divided sections.

9. The spherical shaped semiconductor device according to claim 4, wherein an upper portion of the flexible printed wiring substrate located on a side of the spherical shaped semiconductor device is cut into a plurality of divided sections to be connected to input/output terminals of the spherical shaped semiconductor device.

10. The spherical shaped semiconductor device according to claim 9, wherein the flexible printed wiring substrate has a divided section longer than other divided sections.

11. A flexible printed wiring substrate, comprising of:

a flexible resin layer; and a flexible metallic foil layer stacked on the resin layer, wherein the metallic foil layer forms circuit patterns to electrically connect a spherical shaped semiconductor device to a flat circuit substrate on which the spherical shaped semiconductor device is mounted.

12. The flexible printed wiring substrate according to claim 11, wherein the resin layer is made of polyimide.

13. The flexible printed wiring substrate according to claim 11, wherein the metallic foil layer is made of aluminum.

14. The flexible printed wiring substrate according to claim 11, wherein a lower portion of the flexible printed wiring substrate located on a side of the flat circuit substrate is cut into a plurality of divided sections to be connected to input/output terminals of the flat circuit substrate.

15. The flexible printed wiring substrate according to claim 14, wherein the flexible printed wiring substrate has a divided section longer than other divided sections.

16. The flexible printed wiring substrate according to claim 11, wherein an upper portion of the flexible printed wiring substrate located on a side of the spherical shaped semiconductor device is cut into a plurality of divided sections to be connected to input/output terminals of the spherical shaped semiconductor device.

17. The flexible printed wiring substrate according to claim 16, wherein the flexible printed wiring substrate has a divided section longer than other divided sections.

18. A spherical shaped semiconductor device provided on a flat circuit substrate, comprising:

a protective insulating film formed on an outer surface of the spherical shaped semiconductor device; and a plurality of input/output connection openings which are disposed along an intersected portion of the protective insulating film where a plane face parallel to the flat circuit substrate and running through a center of the spherical shaped semiconductor device intersects the protective insulating film, wherein the spherical shaped semiconductor device is electrically connected to the flat circuit substrate through the flexible printed wiring substrate of claim 14 wound around the spherical shaped semiconductor device.

19. An integrated circuit structure comprising:

a spherical shaped semiconductor device, and a flat circuit substrate, wherein the spherical shaped semiconductor device is electrically connected to the flat circuit substrate through a flexible printed wiring substrate.

* * * * *